US012802723B2

(12) United States Patent
Chang et al.

(10) Patent No.: US 12,802,723 B2
(45) Date of Patent: Nov. 17, 2026

(54) ELECTRIC DEVICE AND MEMORY DEVICE

(71) Applicant: NANYA TECHNOLOGY CORPORATION, New Taipei City (TW)

(72) Inventors: Chuan-Jen Chang, New Taipei City (TW); Ting-Shuo Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 96 days.

(21) Appl. No.: 18/793,963

(22) Filed: Aug. 5, 2024

(65) Prior Publication Data

US 2026/0038545 A1 Feb. 5, 2026

(51) Int. Cl.
*G11C 5/14* (2006.01)
*G05F 1/59* (2006.01)

(52) U.S. Cl.
CPC ................ *G11C 5/147* (2013.01); *G05F 1/59* (2013.01)

(58) Field of Classification Search
CPC ............................... G11C 5/147; G11C 11/412
See application file for complete search history.

(56) References Cited

U.S. PATENT DOCUMENTS 9,940,996 B1 * 4/2018 Pelley .................... G11C 5/145
2005/0283625 A1 * 12/2005 Rotem .................. G06F 1/3203 713/300
2008/0211466 A1 * 9/2008 Park ..................... G09G 3/3696 323/234
2010/0164550 A1 * 7/2010 Son .................... H03K 3/02337 327/88
2015/0279449 A1 * 10/2015 Moriwaki ................ G11C 5/02 365/51
2016/0240233 A1 8/2016 Kuo et al.
2019/0162781 A1 * 5/2019 Kim ................... H03K 19/0013
2019/0235551 A1 8/2019 Pons

FOREIGN PATENT DOCUMENTS

CN 1811987 8/2006
TW 202213339 4/2022
TW 202230988 8/2022

OTHER PUBLICATIONS

"Office Action of Taiwan Counterpart Application", issued on Mar. 25, 2025, p. 1-p. 7.

* cited by examiner

*Primary Examiner* — Amir Zarabian
*Assistant Examiner* — Anthony Thinh Tang
(74) *Attorney, Agent, or Firm* — JCIPRNET

(57) ABSTRACT

An electric device includes a plurality of circuit blocks and a plurality of switch sets. The circuit blocks are respectively coupled to the switch sets. The switch sets provide a first voltage to respectively corresponding circuit blocks in a normal mode. The switch sets respectively provide a plurality of second voltages to corresponding circuit blocks in a standby mode, wherein a voltage value of the first voltage is greater than a voltage value of each of the second voltages.

9 Claims, 3 Drawing Sheets

ELECTRIC DEVICE AND MEMORY DEVICE

BACKGROUND

Technical Field

The present disclosure relates to an electronic device and a memory device, and in particular, to an electronic device and a memory device that are able to save power consumption.

Description of Related Art

As environmental awareness increases, how to incorporate power-saving design in current electronic devices is an issue that should be taken into consideration.

In existing electronic devices, a standby mode mechanism is generally provided and is operated under low power consumption conditions while maintaining a certain level of operation. However, even in the standby mode, the circuit blocks in an electronic device still receive the same operating voltage as in the normal mode. Therefore, since the circuit blocks in the standby mode still receive a relatively high operating voltage, the power consumption and leakage current that the circuit blocks might generate still remain above a certain level, and which results in unnecessary power consumption.

SUMMARY

The present disclosure provides an electronic device and a memory device that may effectively reduce the required power consumption.

The electronic device of the present disclosure includes a plurality of circuit blocks and a plurality of switch sets. The switch sets are respectively coupled to the circuit blocks. The switch sets provide a first voltage to corresponding circuit blocks in a normal mode. The switch sets respectively provide a plurality of second voltages to corresponding circuit blocks in a standby mode. A voltage value of the first voltage is greater than a voltage value of each of the second voltages.

The memory device of the present disclosure includes a plurality of circuit blocks and a plurality of switch sets. The switch sets are respectively coupled to the circuit blocks. The switch sets provide a first voltage to corresponding circuit blocks in a normal mode. The switch sets respectively provide a plurality of second voltages to corresponding circuit blocks in a standby mode. A voltage value of the first voltage is greater than a voltage value of each of the second voltages. Each of the circuit blocks is a memory cell array circuit, a read/write control circuit, an address decoding circuit, a page buffer circuit or a sensor amplifier circuit.

Based on the above, the electronic device and the memory device of the present disclosure have multiple circuit blocks. Each of the circuit blocks may receive operating voltages with different voltage values in different modes through the switch sets. The operating voltage received by the circuit blocks in the normal mode may be greater than the operating voltage received in the standby mode. In this way, the electronic device and the memory device may effectively reduce the required power consumption in the standby mode, thus achieving the effect of saving energy and reducing carbon emission.

DESCRIPTION OF THE EMBODIMENTS

Figure 1:
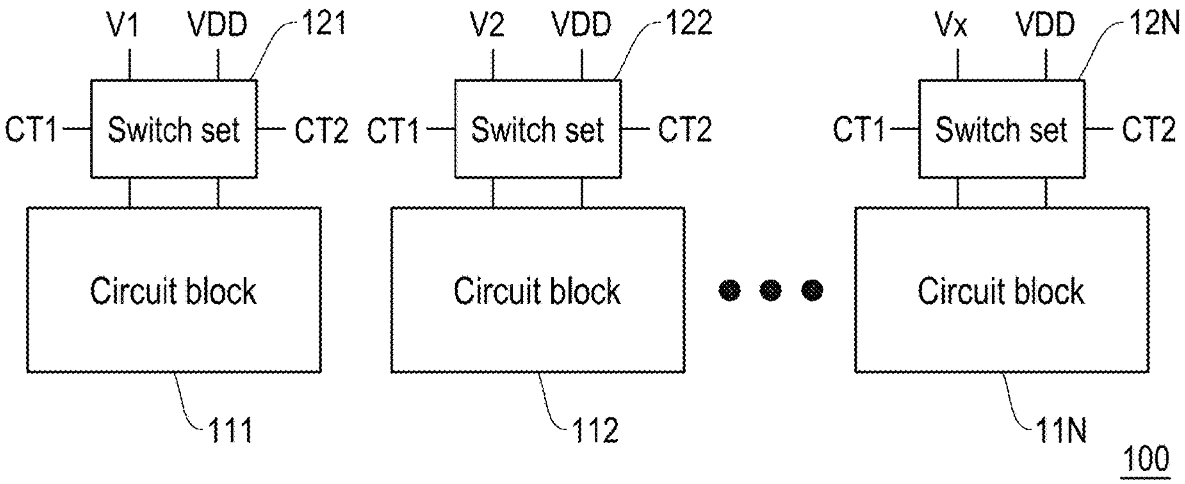
FIG. 1 is a schematic diagram of an electronic device according to an embodiment of the present disclosure.

Please refer to FIG. 1. FIG. 1 is a schematic diagram of an electronic device according to an embodiment of the present disclosure. The electronic device 100 includes a plurality of circuit blocks 111 to 11N and a plurality of switch sets 121 to 12N. The circuit blocks 111 to 11N are coupled to the switch sets 121 to 12N respectively. The switch sets 121 to 12N are configured to select operating voltages supplied to corresponding circuit blocks 111 to 11N. The switch sets 121 to 12N jointly receive a control signal CT1 and jointly receive a control signal CT2. When the electronic device 100 is in the normal mode, the switch sets 121 to 12N may selectively provide the voltage VDD to the corresponding circuit blocks 111 to 11N according to the control signals CT1 and CT2, and use the voltage VDD as the operating voltage of the circuit blocks 111 to 11N. On the other hand, when the electronic device 100 is in the standby mode, the switch sets 121 to 12N may respectively selectively provide voltages V1 to Vx to the corresponding circuit blocks 111 to 11N according to the control signals CT1 and CT2, and use the voltages V1 to Vx as the operating voltage of the circuit blocks 111 to 11N. In this embodiment, the voltage value of voltage VDD may be greater than the voltage values of the voltages V1 to Vx.

In an embodiment of the present disclosure, in the standby mode, the electronic device 100 may switch the operating voltage of the circuit blocks 111 to 11N from the voltage VDD with a relatively high voltage value to the voltages V1 to Vx with a relatively low voltage value. In this way, in the standby mode, the voltage value of the operating voltage of each of the circuit blocks 111 to 11N in the electronic device 100 may be effectively reduced, thereby reducing the overall power consumption of the electronic device 100 and achieving the effect of saving energy and reducing carbon emission.

In this embodiment, the control signals CT1 and CT2 may be the same signal or different signals, and the voltage values of the voltages V1 to Vx may be exactly the same, partially the same or completely different from each other.

Figure 2:
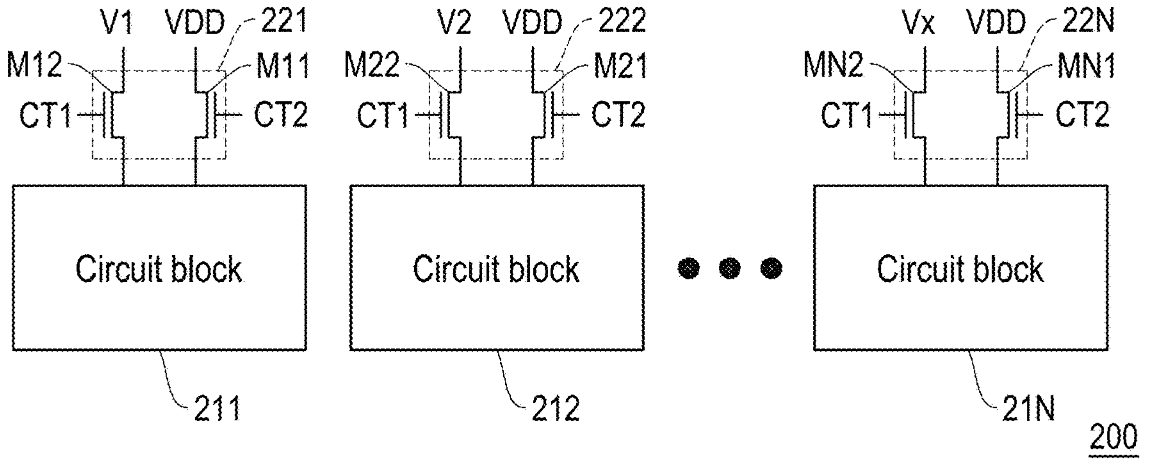
FIG. 2 is a schematic diagram of an electronic device according to another embodiment of the present disclosure.

Please refer to FIG. 2, FIG. 2 is a schematic diagram of an electronic device according to another embodiment of the present disclosure. The electronic device 200 includes a plurality of circuit blocks 211 to 21N and a plurality of switch sets 221 to 22N. The circuit blocks 211 to 21N are coupled to the switch sets 221 to 22N respectively. The switch sets 221 to 22N are configured to select operating voltages respectively supplied to corresponding circuit blocks 211 to 21N.

In this embodiment, the switch assembly 221 has a plurality of switches constructed by transistors M11 and M12 respectively. The first terminal of the transistor M11 receives the voltage VDD; the second terminal of the transistor M11 is coupled to the corresponding circuit block 211; and the control terminal of the transistor M11 receives the control signal CT1. The first terminal of the transistor M12 receives the voltage V1; the second terminal of the transistor M12 is coupled to the corresponding circuit block 211; and the control terminal of the transistor M12 receives the control signal CT2. In addition, the switch assembly 222 has a plurality of switches constructed by transistors M21 and M22 respectively. The first terminal of the transistor M21 receives the voltage VDD; the second terminal of the transistor M21 is coupled to the corresponding circuit block 212; and the control terminal of the transistor M21 receives the control signal CT1. The first terminal of the transistor M22 receives the voltage V2; the second terminal of the transistor M22 is coupled to the corresponding circuit block 212; and the control terminal of the transistor M22 receives the control signal CT2. By analogy, the switch assembly 22N has a plurality of switches constructed by transistors MN1 and MN2 respectively. The first terminal of the transistor MN1 receives the voltage VDD; the second terminal of the transistor MN1 is coupled to the corresponding circuit block 21N; and the control terminal of the transistor MN2 receives the control signal CT1. The first terminal of the transistor MN2 receives the voltage V2; the second terminal of the transistor MN2 is coupled to the corresponding circuit block 21N; and the control terminal of the transistor MN2 receives the control signal CT2.

In terms of operation details, when the electronic device 200 is in the normal mode, the control signal CT1 may have a first voltage value, and the control signal CT2 may have a second voltage value, wherein the first voltage value and the second voltage value are different. Correspondingly, the transistors M11 to MN1 in the switch sets 221 to 22N may be turned on according to the control signal CT1, and the transistors M12 to MN2 in the switch sets 221 to 22N may be cut off according to the control signal CT2, wherein in this embodiment, the transistors M11 to MN1 and the transistors M12 to MN2 may have the same type of conduction.

When the electronic device 200 is in the normal mode, the turned-on transistors M11 to MN1 may transmit the voltage VDD to the corresponding circuit blocks 211 to 21N respectively to serve as the operating voltage of the circuit blocks 211 to 21N. The voltage value of the voltage VDD may be greater than the voltage values of voltages V2 to Vx. In this way, in the normal mode, the circuit blocks 211 to 21N may maintain a normal operating state based on the operating voltage (voltage VDD) with a relatively large voltage value.

When the electronic device 200 is in the standby mode, the turned-on transistors M12 to MN2 may transmit the voltages V1 to Vx to the corresponding circuit blocks 211 to 21N respectively to serve as the operating voltage of the circuit blocks 211 to 21N. In this way, in the standby mode, the circuit blocks 211 to 21N may perform a standby operation with low power consumption based on the operating voltage (voltages V1 to Vx) with a relatively small voltage value.

Incidentally, in this embodiment, the transistors M11 to MN1 and the transistors M12 to MN2 may both be N-type transistors. Under such conditions, when the electronic device 200 is in the normal mode, the control signal CT1 may be a logic-high voltage, and the control signal CT2 may be a logic-low voltage. In contrast, when the electronic device 200 is in the standby mode, the control signal CT1 may be a logic-low voltage, and the control signal CT2 may be a logic-high voltage.

In other embodiments of this implementation, the transistors M11 to MN1 and the transistors M12~MN2 may both be P-type transistors. Under such conditions, when the electronic device 200 is in the normal mode, the control signal CT1 may be a logic-low voltage, and the control signal CT2 may be a logic-high voltage. In contrast, when the electronic device 200 is in the standby mode, the control signal CT1 may be a logic-high voltage, and the control signal CT2 may be a logic-low voltage.

Figure 3:
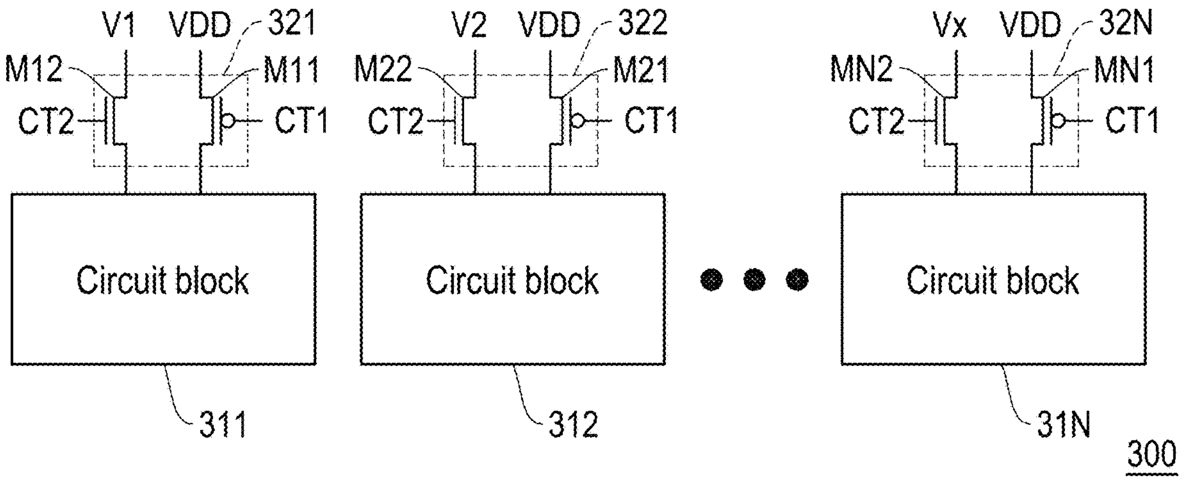
FIG. 3 is a schematic diagram of an electronic device according to another embodiment of the present disclosure.

Please refer to FIG. 3, FIG. 3 is a schematic diagram of an electronic device according to another embodiment of the present disclosure. The electronic device 300 includes a plurality of circuit blocks 311 to 31N and a plurality of switch sets 321 to 32N. The circuit blocks 311 to 31N are coupled to the switch sets 321 to 32N respectively. The switch sets 321 to 32N are configured to select operating voltages supplied to corresponding circuit blocks 311 to 31N.

In this embodiment, the switch assembly 321 has a plurality of switches constructed by transistors M11 and M12 respectively; the switch assembly 322 has a plurality of switches constructed by transistors M21 and M22 respectively; . . . ; the switch assembly 32N has a plurality of switches constructed by transistors MN1 and MN2 respectively. The operation mode of the switch sets 321 to 32N is similar to the embodiment of FIG. 2 and will not be described in detail here.

Different from the previous embodiment, in this embodiment, the conduction state of the transistors M11 and M21 to MN1 is complementary to the conduction state of the transistors M12 and M22 to MN2. In FIG. 3, the transistors M11 and M21 to MN1 may be P-type transistors, and the transistors M12 and M22 to MN2 may be N-type transistors. Under such conditions, the control signals CT1 and CT2 may be signals with the same voltage value, or the control signals CT1 and CT2 may be the same signal. In detail, when the electronic device 300 is in the normal mode, the control signals CT1 and CT2 may both be logic-low voltages. In contrast, when the electronic device 300 is in the standby mode, the control signals CT1 and CT2 may be logic-high voltages.

In other embodiments of the present disclosure, the transistors M11 and M21 to MN1 may also be configured as N-type transistors, and the transistors M12 and M22 to MN2 may be configured as P-type transistors, and there is no limitation thereto. Under such conditions, when the electronic device 300 is in the normal mode, the control signals CT1 and CT2 may both be logic-high voltages. In contrast, when the electronic device 300 is in the standby mode, the control signals CT1 and CT2 may be logic-low voltages.

Figure 4:
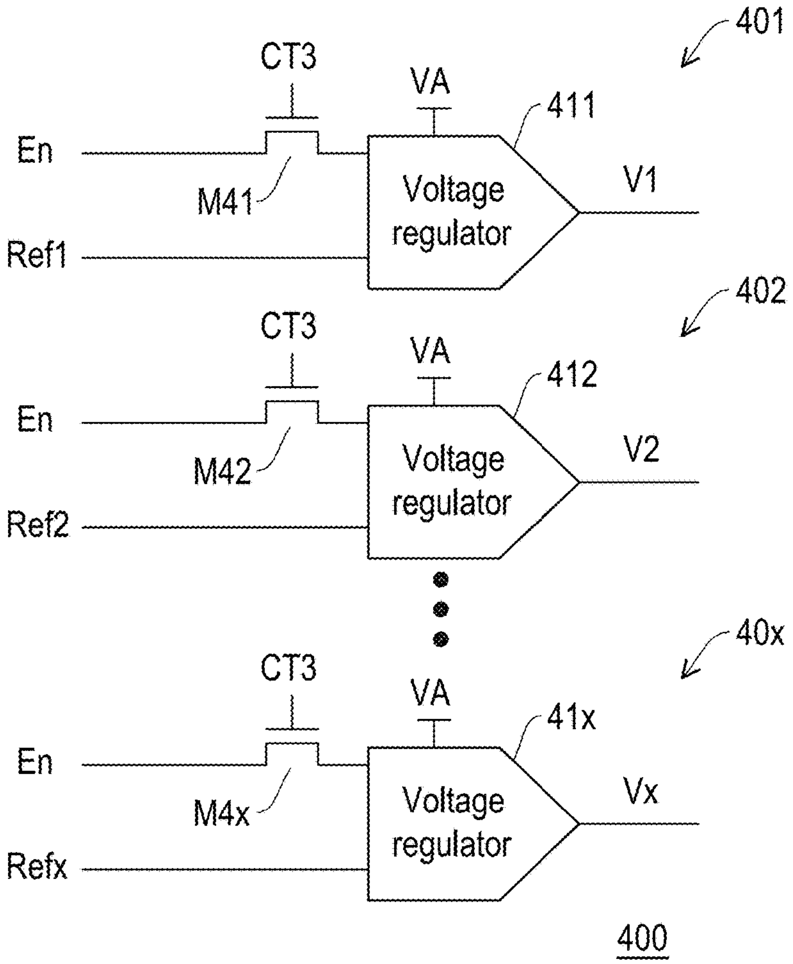
FIG. 4 is a partial circuit diagram of an electronic device according to an embodiment of the present disclosure.

Please refer to FIG. 4 below. FIG. 4 is a partial circuit diagram of an electronic device according to an embodiment of the present disclosure. The electronic device 400 further includes a plurality of voltage generators 401 to 40*x*. The voltage generators 401 to 40*x* are configured to generate the voltages V1 to Vx respectively, and provide the voltages V1 to Vx to the switch sets 121 to 12N, 221 to 22N and 321 and 32N in the embodiments of FIG. 1, FIG. 2 and FIG. 3. In this embodiment, the voltage generator 401 includes a voltage regulator 411 and a switch constructed by the transistor M41; the voltage generator 402 includes a voltage regulator 412 and a switch constructed by the transistor M42; . . . ; and the voltage generator 40*x* includes a voltage regulator 41*x* and a switch constructed by a transistor M4*x*. The voltage regulators 411 to 41*x* may receive the same voltage VA as the operating voltage. In some embodiments of the present disclosure, the voltage VA may be the same voltage as the voltage VDD in the previous embodiments, or may also be different from the voltage VDD. The transistors M41 to M4*x* are respectively coupled between the paths along which the voltage regulators 411 to 41*x* receive the enable signal En, and are jointly controlled by a control signal CT3. The voltage regulators 411 to 41*x* also receive reference voltages to Refx respectively.

When the electronic device 400 is in the normal mode, the voltage generators 401 to 40*x* do not need to provide the voltages V1 to Vx. Under the condition, the transistors M41 to M4*x* are cut off according to the control signal CT3, and the transmission path for transmitting the enable signal En to the voltage regulators 411 to 41*x* is cut. Under the condition, the voltage regulators 411 to 41*x* are not operated.

When the electronic device 400 is in the standby mode, the voltage generators 401 to 40*x* may provide voltages V1 to Vx. Under the circumstances, the transistors M41 to M4*x* are turned on according to the control signal CT3, and transmit the enable signal En to the voltage regulators 411 to 41*x*. Under the circumstances, the voltage regulators 411 to 41*x* are activated and operated based on the voltage VA and the reference voltages to Refx to generate voltages V1 to Vx respectively.

In this embodiment, the transistors M41 to M4*x* may be P-type transistors or N-type transistors, and there is no specific limitation thereto. Furthermore, the voltage regulators 411 to 41*x* may be low dropout (LDO) voltage regulators, and may be implemented using any LDO voltage adjustment circuit commonly known to those of ordinary skill in the art, and there is no specific limitation thereto.

It is worth noting that in this embodiment, the number of voltage regulators 411 to 41*x* is not necessarily the same as the number of corresponding switch sets. In an embodiment of the present disclosure, among the voltages V1 to Vx, multiple switch sets may receive different voltages V1 to Vx respectively, or multiple switch sets may receive the same voltage (such as voltage V1). Moreover, the voltage values of the voltages V1 to Vx may be all the same, partially the same, or all different from each other. In actual operation, designers may configure the corresponding voltage values of V1 to Vx according to the operating voltage required by each circuit block in standby mode, and there is no specific limitation thereto.

Figure 5:
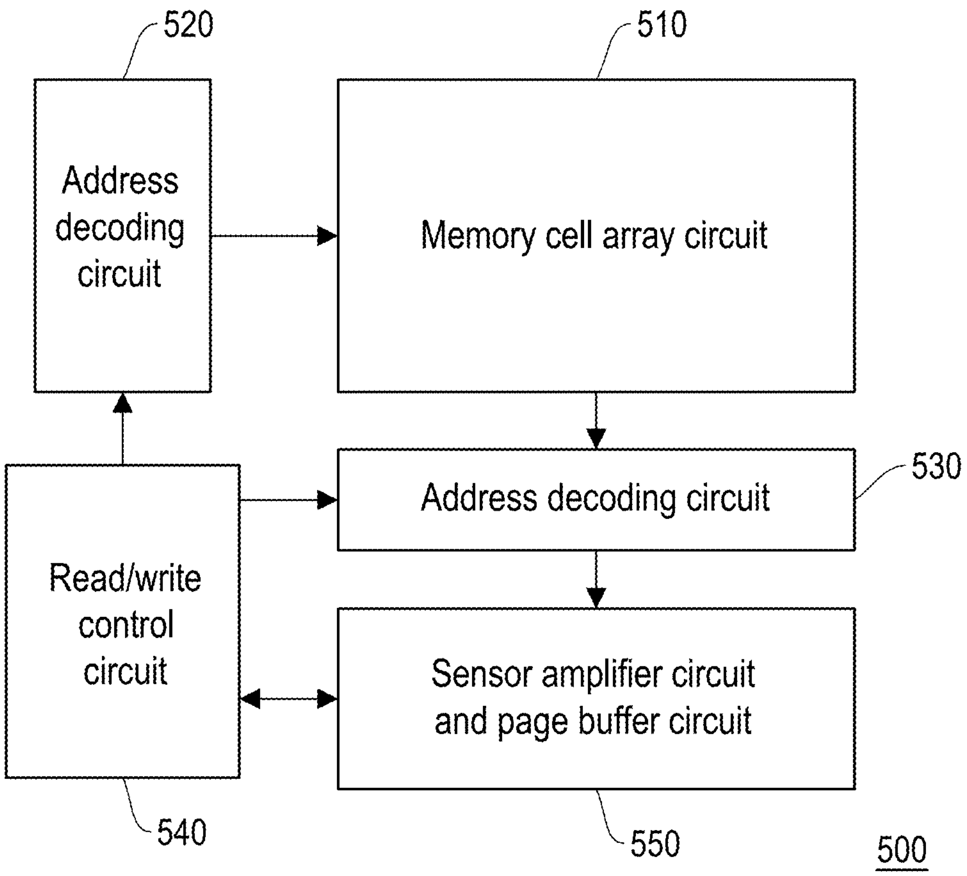
FIG. 5 is a schematic diagram of a memory device according to an embodiment of the present disclosure.

Please refer to FIG. 5 below. FIG. 5 is a schematic diagram of a memory device according to an embodiment of the present disclosure. The memory device 500 includes a memory cell array circuit 510, address decoders 520 and 530, a read/write control circuit 540, and a sensor amplifier circuit and page buffer circuit 550. In this embodiment, the memory cell array circuit 510, the address decoders 520 and 530, the read/write control circuit 540, the sensor amplifier circuit and the page buffer circuit 550 may be divided into multiple circuit blocks respectively. In this embodiment, the memory cell array circuit 510 may be a memory cell array of any form of memory cells. The address decoders 520 and 530 may be decoders in X-direction and decoders in Y-direction respectively.

Referring to any one of the embodiments of FIG. 1 to FIG. 3 of the present disclosure, the memory device 500 may be used as any one of the electronic devices 100 to 300, and is provided with switch sets respectively corresponding a plurality of circuit blocks such as the memory cell array circuit 510, address decoders 520 and 530, read/write control circuit 540, sensor amplifier circuit and page buffer circuit 550.

In different modes, the memory device 500 provides the voltage VDD or the voltages V1 to Vx through a plurality of switch sets respectively corresponding to the memory cell array circuit 510, the address decoders 520 and 530, the read/write control circuit 540, the sensor amplifier circuit and the page buffer circuit 550, and the voltage VDD or the voltages V1 to Vx serve as the operating voltage of the memory cell array circuit 510, the address decoders 520 and 530, the read/write control circuit 540, the sensor amplifier circuit and the page buffer circuit 550.

In this embodiment, the address decoders 520 and 530 may be integrated into a single circuit block, or divided into multiple circuit blocks. The memory cell array circuit 510 may also be integrated into a single circuit block or divided into multiple circuit blocks. The sensor amplifier circuit and page buffer circuit 550 may be split into two blocks, namely the sensor amplifier circuit and the page buffer circuit, or integrated into the same single circuit block.

To sum up, the present disclosure divides the electronic device into multiple circuit blocks and provides switch sets respectively corresponding to the multiple circuit blocks. Through each switch assembly, the operating voltage received by each of the circuit blocks may be switched in different modes of the electronic device. In this way, in standby mode, each of the circuit blocks may receive a relatively low operating voltage, thereby effectively reducing the required power consumption.

What is claimed is:

1. An electronic device, comprising:

a plurality of circuit blocks;

a plurality of switch sets respectively coupled to the plurality of circuit blocks, wherein the plurality of switch sets provide a first voltage to the plurality of corresponding circuit blocks in a normal mode, the plurality of switch sets respectively provide a plurality of second voltages to the plurality of corresponding circuit blocks in a standby mode, wherein a voltage value of the first voltage is greater than a voltage value of each of the plurality of second voltages, wherein the plurality of second voltages provided by any two of the plurality of switch sets have different voltage values during the standby mode; and a plurality of voltage generators respectively generating the plurality of second voltages, wherein each of the plurality of voltage generators comprises:

a switch determining whether to provide an enable signal based on a third control signal; and a voltage regulator generating each of the plurality of second voltages according to the enable signal and a reference voltage based on a power supply voltage, wherein in the normal mode, the switch is cut off and the transmission path for transmitting the enable signal to the voltage regulator is cut, and in the standby mode, the switch is turned on and transmits the enable signal to the voltage regulator.

2. The electronic device according to claim 1, wherein each of the plurality of switch sets comprises:

a first switch having a first terminal for receiving the first voltage, wherein a second terminal of the first switch is coupled to each of the plurality of corresponding circuit blocks, the first switch is controlled by a first control signal; and a second switch having a first terminal for receiving the second voltage, wherein a second terminal of the second switch is coupled to each of the plurality of corresponding circuit blocks, and the second switch is controlled by a second control signal.

3. The electronic device according to claim 2, wherein the first switch is a first transistor, and the second switch is a second transistor.

4. The electronic device according to claim 3, wherein a conduction state of the first transistor is complementary to a conduction state of the second transistor, and the first control signal is the same as the second control signal.

5. The electronic device according to claim 3, wherein a conduction state of the first transistor is the same as a conduction state of the second transistor, and the first control signal is complementary to the second control signal.

6. The electronic device according to claim 1, wherein a voltage value of the power supply voltage is greater than a voltage value of each of the plurality of second voltages.

7. The electronic device according to claim 1, wherein the voltage regulator is a low dropout voltage regulator.

8. A memory device, comprising:

a plurality of circuit blocks;

a plurality of switch sets respectively coupled to the plurality of circuit blocks, wherein the plurality of switch sets provide a first voltage to the plurality of corresponding circuit blocks in a normal mode, the plurality of switch sets respectively provide a plurality of second voltages to the plurality of corresponding circuit blocks in a standby mode, wherein a voltage value of the first voltage is greater than a voltage value of each of the plurality of second voltages, wherein each of the plurality of circuit blocks is a memory cell array circuit, a read/write control circuit, an address decoding circuit, a page buffer circuit or a sensor amplifier circuit, wherein the plurality of second voltages provided by any two of the plurality of switch sets have different voltage values during the standby mode; and a plurality of voltage generators respectively generating the plurality of second voltages, wherein each of the plurality of voltage generators comprises:

a switch determining whether to provide an enable signal based on a third control signal; and a voltage regulator generating each of the plurality of second voltages according to the enable signal and a reference voltage based on a power supply voltage, wherein in the normal mode, the switch is cut off and the transmission path for transmitting the enable signal to the voltage regulator is cut, and in the standby mode, the switch is turned on and transmits the enable signal to the voltage regulator.

9. The memory device according to claim 8, wherein each of the plurality of switch sets comprises:

a first switch having a first terminal for receiving the first voltage, wherein a second terminal of the first switch is coupled to each of the plurality of corresponding circuit blocks, the first switch is controlled by a first control signal; and a second switch having a first terminal for receiving the second voltage, wherein a second terminal of the second switch is coupled to each of the plurality of corresponding circuit blocks, and the second switch is controlled by a second control signal.

* * * * *